United States Patent [19]
Oakabe et al.

[11] Patent Number: 4,786,780
[45] Date of Patent: Nov. 22, 1988

[54] METHOD FOR TRIMMING THIN-FILM TRANSISTOR ARRAY

[75] Inventors: Kazuya Oakabe, Moriya; Chisato Iwasaki, Furukawa; Hitoshi Seki; Yasuhiko Kasama, both of Izumi, all of Japan

[73] Assignee: Alps Electric Co., Ltd., Tokyo, Japan

[21] Appl. No.: 160,533

[22] Filed: Feb. 26, 1988

[30] Foreign Application Priority Data

Apr. 21, 1987 [JP] Japan .................................. 62-98346

[51] Int. Cl.$^4$ ............................................. B23K 26/00
[52] U.S. Cl. .................................. 219/121.72; 357/51
[58] Field of Search ................ 219/121 LG, 121 LN; 357/51; 338/195, 334

[56] References Cited

U.S. PATENT DOCUMENTS

| | | | |
|---|---|---|---|
| 4,150,366 | 4/1979 | Price | 338/195 |
| 4,240,094 | 12/1980 | Mader | 357/45 |
| 4,476,375 | 10/1984 | Ogawa | 219/121 LG X |

*Primary Examiner*—C. L. Albritton
*Attorney, Agent, or Firm*—Guy W. Shoup; Paul J. Winters

[57] ABSTRACT

A thin-film transistor array is constructed of at least a first thin-film transistor and a second thin-film transistor connected in parallel with the first thin-film transistor. These transistors are formed on a substrate under the condition that a source bus and a gate bus are connected to these transistors with forming a crossover portion. These parallel-connected transistors drive one pixel of a liquid crystal element. The first and second thin-film transistors are independently positioned in a symmetrically positional relationship with sandwiching the gate and source buses. In accordance with a laser trimming method of the invention, either gate bus or source bus located at one side of the crossover portion is first cut out so as to electrically disconnect the normally operable thin-film transistor from the array.

2 Claims, 3 Drawing Sheets

METHOD FOR TRIMMING THIN-FILM TRANSISTOR ARRAY

BACKGROUND OF THE INVENTION

1. Field of the Invention

The present invention relates to a method for trimming a thin-film transistor array capable of active-matrix-driving a liquid crystal display element.

2. Description of the Related Art

A thin-film transistor (referred to as "a TFT") array constructed of a 1-pixel and 2-FTT arrangement is widely known in the art where two thin-film transistors are connected parallel to each other for driving a single pixel of a liquid crystal display element.

A typical TFT array constructed of the 1-pixel and 2-FTT arrangement is illustrated in FIG. 4. In this type of TFT array, a large quantity of gate buses 2 and source buses 3 made of molyblenum, or the like are intersected with each other at a right angle on a glass substrate 1. On a crossover portion 4 where these gate buses 2 are intersected with these source buses 3, the source buses 3 run over the gate buses 2, and an insulating film 5 is employed between the corresponding gate bus 2 and source bus 3 not to conduct these intersected buses 2 and 3. As illustrated in FIG. 4, one gate line 6 is branched from the gate bus 2 adjacent to each of the crossover portion 4, whereas two source lines 7 and 7 are similarly branched from the source bus 2. These branched gate line 6 and source lines 7, 7 are connected to a common gate electrode and two source electrode of a pair of TFT 8 respectively, which are formed adjacent to the crossover portion 4. This TFT (thin-film transistor) 8 is constructed of a first TFT 8a and a second TFT 8b, which are connected parallel to the source bus 3, gate bus 2 and pixel electrode 9. Either the first TFT 8a or the second TFT 8b drives one of the liquid crystal display element 1.

In such a conventional TFT array, a shortcircuit defect may occur unavoidably in the manufacturing process of the TFT array, which is caused by the various reasons. As the typical shortcircuit defect, the gate electrode is shortcircuited with the source. In the TFT array constructed of 1-pixel-2-TFT arrangement, as illustrated in FIG. 4, the shortcircuit, in all probability, is produced in the positions indicated by (A), (B) and (C) in FIG. 4. Since such a shortcircuit defect appears as the line defect or point defect in the liquid crystal element, the shortcircuit defect is cut out from the gate electrode or source by means of the laser trimming method in the conventional TFT array manufacturing process.

According to one of the trimming process for the shortcircuit defect occurring at any point of (A), (B) and (C), at first, an intermediate position ① of the source bus 3 between the branch points of two source lines 7 and 7 thereof is cut out. Thereafter, the source bus 3 is cut by way of the trimming process at a position indicated by ② between the crossover portion 4 of the source bus 3 and the branch point of the source line 11. As a result, if the shortcircuit has been made at a point (A) of the first TFT 8a, this shortcircuit defect is cut out from the source bus 3. In addition, if the source bus 3 is cut out at a position ③ adjacent to a terminal S1 of the crossover portion 4 of the source bus 3, the shortcircuit occurring at a point (B) of the crossover portion 4 is cut out from the source bus 3. Then, when the source bus 3 is cut at a position 4 adjacent to another terminal S2 of the source line branch point of the source bus 3, the shortcircuit which has occurred at the point (C) of the second TFT 8b is cut out. As a consequence, even if the shortcircuit occurs at any points (A), (B) and (C) of the source bus 3, the shortcuited source bus portion can be cut out from the source bus 3. Then, if power is supplied via both terminals S1 and S2 of the source bus 3, one of the first and second TFT 8a and 8b can be brought into the active condition, resulting in prevention of the point defect.

However, the above-described laser trimming method involves the following drawback, where the laser trimming is successively performed from the position ① to the remaining positions ②③ and ④ in this order. That is to say, if the shortcircuit defect occurs only in the point (B) of the crossover portion 4, the first TFT 8a is necessarily cut out in which no shortcircuit problem is present, i.e., no problem with the first TFT 8a. Accordingly, since the second TFT 8b can be normally operated, there is no point defect. However, the resultant contrast ratio of the liquid crystal element which is driven by solely the second TFT 8b, is lowered, as compared with that by both the first and second TFT 8a and TFT 8b.

The present invention has been accomplished in an attempt to solve the problems mentioned above, and has an object to provide a novel trimming method by which the normal TFT is not cut out, in the laser trimming method for the TFT array of one-pixel-2-TFT circuit arrangement.

SUMMARY OF THE INVENTION

The above-described object of the invention is accomplished by providing a method for laser-trimming a thin-film transistor array where a first and second TFTs are separately arranged in a symmetrical relationship with sandwiching a gate bus or a source bus, a laser trimming treatment is firstly performed for the gate bus or source bus located at one side of the crossover portion.

According to the laser trimming method of the invention, it can be prevented to cut out either the first, or second TFT which is normally operable when the shortcircuit defect occurring in the crossover portion is cut out. After the laser trimming treatment, an auxiliary bus connecting between the laser-cut gate buses, or the source buses is simultaneously formed when the light shield of the thin-film transistor is formed, so that the power can be supplied via only one terminal of the thin-film transistor array.

BRIEF DESCRIPTION OF THE DRAWINGS

For a better understanding of these and other objects of the present invention, reference is made to the following detailed description of the invention to be read in conjunction with the following drawings, in which.

DETAILED DESCRIPTION OF PREFERRED EMBODIMENTS

Figure 1:
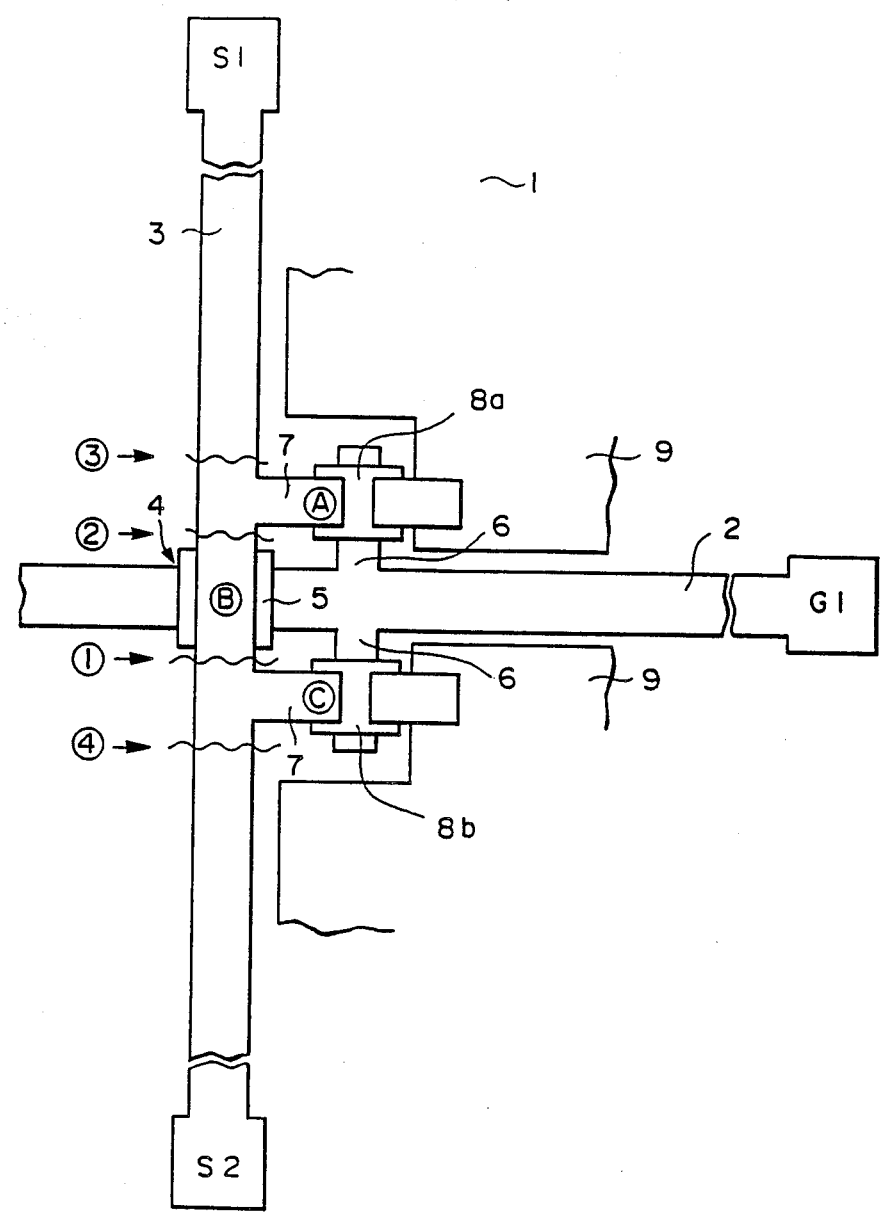
FIGS. 1 and 3 are a plan view of a thin-film transistor array for explaining how the laser triming method is operated according to the present invention.
Figure 2:
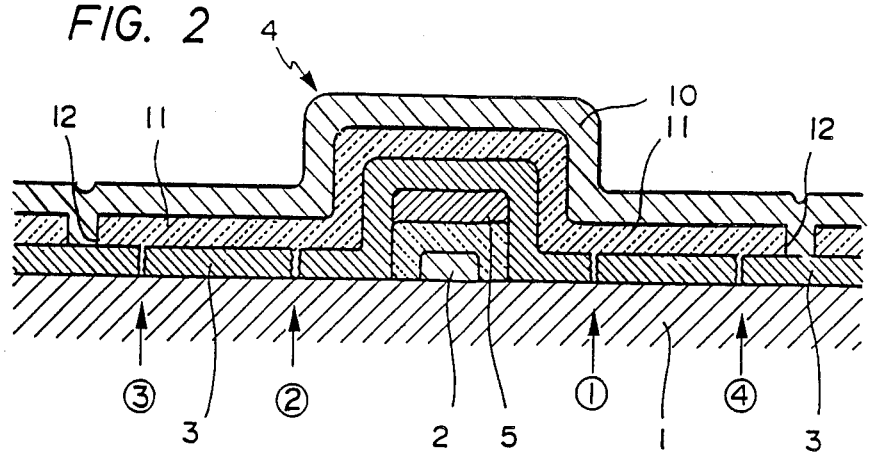
FIG. 2 is a sectional view of the thin-film transistor array according to the invention, where the auxiliary bus is formed after the laser triming treatment.

FIG. 1 is a plan view of a thin-film transistor (TFT) array for explaining a laser trimming method, or treatment according to a preferred embodiment of the invention. As easily seen from FIG. 1, this thin-film transistor array is so constructed that each of source lines 7 and 7 is branched from a source bus 3 located at both sides of a crossover portion 4, with sandwiching a gate bus 2 in a symmetrical relationship, and also two gate lines 6 and 6 are branched from one point near the crossover portion 4 of the gate bus 2 in the opposite directions, respectively. A first thin-film transistor TFT 8a and a second thin-film transistor TFT 8b are independently formed at two intersected portions between the source lines 7 and 7, and the gate lines 6 and 6. As a result, these TFTs 8a and 8b are connected parallel to the source bus 3 and the gate bus 2, and arranged in a symmetrical relationship with respect to the gate bus 2. In other words, these thin-film transistors 8a and 8b sandwich the gate bus 2. Thus, the respective thin-film transistors 8a and 8b are connected to a pixel electrode which is constructed of either one or a pair of electrodes, together with one of a pair of TFTs similarly formed ajacent to the other crossover portion(not shown in detail), and these two TFTs drive one pixel, i.e., a 1-pixel-2-TFT arrangement.

Referring now to the TFT array shown in FIG. 1, a description will now be made of the laser trimming method according to the preferred embodiment. When a shortcircuit problem is detected during the insulating inspection performed between one terminal S1 of the source 3 and the terminal G1 of the gate bus 2, the position ① beside the crossover portion 4 of the source bus 3 is cut out by the laser trimming method. Thereafter, the insulating inspection is again performed between the terminal S1 and the terminal G1. If there is a shortcircuit between them, another position ② the source bus 3 is cut out. Thus, if the shortcircuit is present in the point (B) of the crossover portion 4, this shortcircuited portion is cut out from the source bus 3. In addition, the subsequent insulating inspection is carried out between the terminal S1 and the terminal G1. If a shortcircuit problem occurs therein, it can be detected that such a shortcircuit exists at the point (A) of the first TFT 8a, so that the the position ③ source bus 3 is accordingly cut out. Subsequently, the insulating inspection is effected between the other terminal S2 of the source bus 3 and the terminal G1. If a shortcircuit is inspected, it can be recognized that the point (C) of the second TFT 8b is shortcircuited. As a consequence, the position ④ of the source bus 3 is cut out.

According to the laser trimming method, or treatment of the preferred embodiment, when the point (B) of the crossover portion 4 is accidentally shortcircuited, this shortcircuited portion is cut out by cutting the positions ① and ②. However, both the first and second TFTs 8a and 8b are not cut out according to the present embodiment. Consequently, 8a and 8b are not necessarily cut out in order to cut the shorcircuited point (B).

Another laser trimming method may be employed for cutting out a thin-film transistor array according to the invention. That is to say, when a shortcircuit problem is detected during the insulation inspection effected between the gate bus terminal G1 and the source bus terminal S1, the position ② of the source bus 3 is first cut out. Furthermore, the subsequent insulation inspection is performed between the gate bus terminal G1 and the source bus terminal S1. If another shortcircuit phenomenon is detected, the position ① of the source bus 3 is cut out. When a shortcircuit problem is found out between the gate bus terminal G1 and the source bus terminal S1 during the third insulation inspection, the position ③ of the source bus 3 is cut out. As a result, the shortcircuit problem occurring at the portions (A), (B) and (C) can be separated from the source bus 3.

Also, the shortcircuit occurring at the portion (B) of the crossover portion 4 is performed by cutting out the positions ② and ① of the source bus 3 in this preferred embodiment. However, there is no problem that the normally operable TFT 8a or TFT 8b is not electrically separated from the source bus 3.

As previously described in detail, event if either the position ① or ② of the source bus 3 is first of all cut out according to the laser trimming method of the invention, there is no problem to electrically cut out the first or second TFT 8a or 8b from the TFT array because the shortcircuit trimming is carried out at the crossover portion 4. Consequently, one pixel can be driven by two thin-film transistors 8a and 8b so that the contrast ratio is not lowered.

In addition, after the above-described laser trimming treatment is accomplished, an auxiliary bus 10 connecting the cut source line 3 may be employed according to the invention. This auxiliary bus 10 is electrically connected to the source bus 3 by contact holes 12, 12 which have been formed during the formation of a passivation film 11. Since the suxiliary bus 10 is communicated with the source bus 3, the power can be supplied via either the terminal S1, or S2 of the source bus 3 to the first and second TFT 8a and 8b. It should be noted that if the formation of the auxiliary bus 10 is simultaneously performed with the formation of the light shield for the first and second TFT 8a and 8b, no additional manufacturing process is required.

Figure 3:
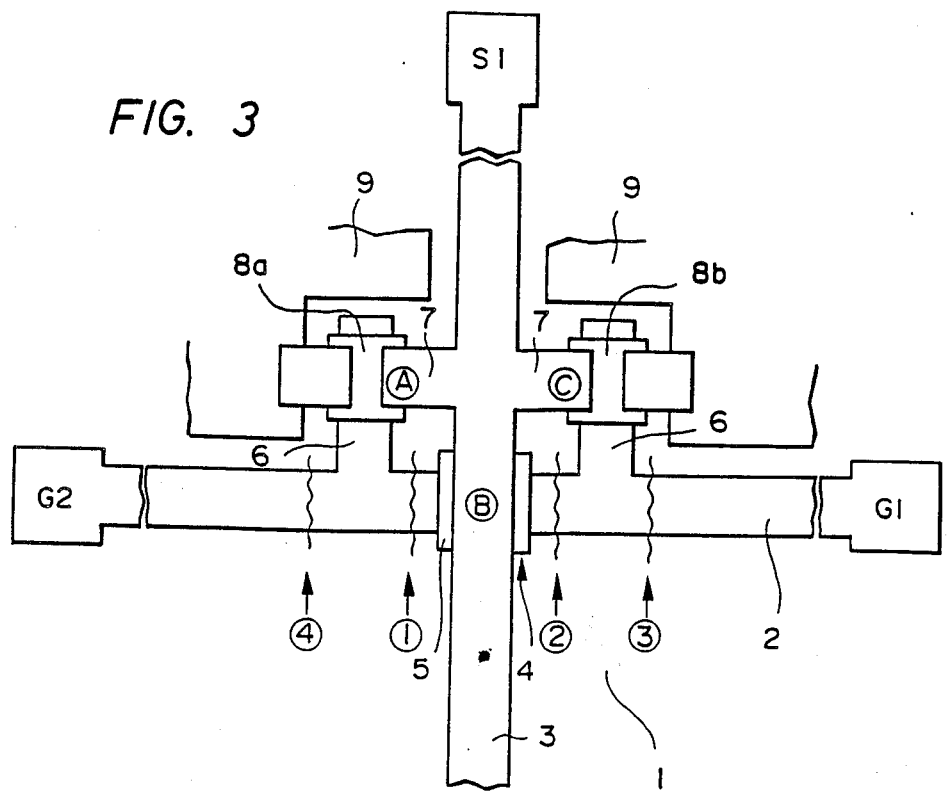
Figure 4:
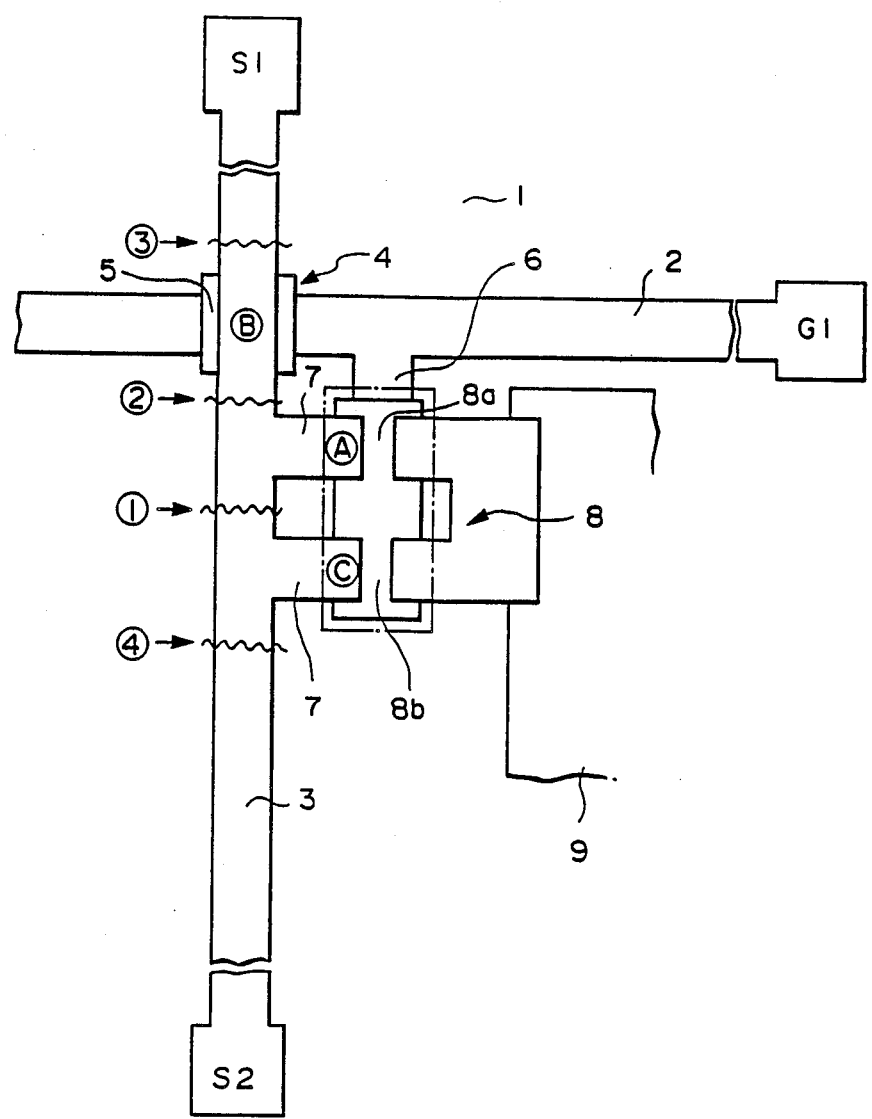
FIG. 4 is a plan view of the thin-film transistor array for explaining the conventional laser trimming method.

In FIG. 3, there is shown a gate bus to which the laser trimming method according to the invention is applied. As easily seen from the TFT array of FIG. 3, a first TFT 8a and a second TFT 8b are separatedly employed at both sides of the source bus 3. Each of gate lines 6 and 6 is independently branched from both sides of the crossover portion ④ of the gate bus 2, whereas two source lines 7 and 7 are branched from one side of the crossover portion 4 of the source bus 2 in an opposite direction. Accordingly, a first TFT 8a and a second TFT 8b are separately formed at two crossover portions between these gate lines 6, 6 and source lines 7, 7.

Also in this TFT array, firstly, the position ① of the gate bus 2 is cut out, and thereafter, the positions ②, ③ and ④ are successively cut out in this order. Similarly, the position ② of the gate bus 2 is first of all cut out, and subsequently the positions ①, ④ and ③ thereof are cut out in this order. If the shortcircuit defect occurring at the portion (B) of the crossover portion 4 is desired to be cut out from the source bus 3, the positions 1 and 2 of the gate bus 2 are merely cut out, so that the normally operable TFT 8a and 8b are not cut out from the TFT array. Also, according to the present embodiment, the gate bus 2 which has been cut out is connected by means of the auxiliary bus, with the result that the power can be supplied via only one terminal to the TFT array.

According to the laser trimming method of the invention, as long as the TFT array arrangements shown in FIG. 1 or 3 are utilized, this trimming method may be applied to a TFT array of 1-pixel-2-TFT arrangement fabricated by the forward staggered construction where the gate bus is intersected over the source bus, and the stacked construction of the source, drain and gate electrodes of the TFT is inverted. In this TFT array, the auxiliary bus may be similarly employed.

While has been described in above, the laser trimming method fo a thin-film array according to the invention can be utilized to, first, cut out either the gate bus, or the source bus located at the side of the crossover portion of the TFT array. This TFT array is fabricated by a 1-pixel-2-TFT arrangement where two TFTs are connected parallel to one pixel of the liquid crystal element, and the first and second TFTs are separately positioned with sandwiching the gate bus, or source bus.

As a result, when the shortcircuit defect occurring at the crossover portion is cut out so as to be electrically separated from the gate and source, there is no risk that the normally operable TFT is also cut out. It can prevent the necessary TFT from being cut out. Consequently, when the liquid crystal element is driven by this TFT array, the number of the pixels having the better contrast ratio is increased, resulting in the improved display performance of the liquid crystal element.

What is claimd is:

1. A method for trimming a thin-film transistor array wherein a plurality of gate buses and of source buses are intersected with each other at a crossover portion on a substrate, and at least a first thin-film transistor is connected in parallel with a second thin-film transistor which are formed on the substrate adjacent to the crossover portion and connected to said gate buses and source buses so as to drive at least one pixel of a liquid crystal element, said first and second thin-film transistors being separately positioned in a symmetrically positional relationship with sandwiching one of the gate buses and source buses, comprising the steps of:

starting laser trimming for one of said gate buses and source buses located at one side of the crossover portion.

2. A method for trimming a thin-film transistor array as claimed in claim 1, further comprising an auxiliary bus for connecting the laser-trimmed buses.

* * * * *